US007615731B2

(12) United States Patent
Heiler et al.

(10) Patent No.: US 7,615,731 B2
(45) Date of Patent: Nov. 10, 2009

(54) HIGH FILL-FACTOR SENSOR WITH REDUCED COUPLING

(75) Inventors: Gregory N. Heiler, Hilton, NY (US); Timothy J. Tredwell, Fairport, NY (US); Mark D. Bedzyk, Pittsford, NY (US); Roger S. Kerr, Brockport, NY (US); Yuriy Vygranenko, Waterloo (CA); Denis Striakhilev, Waterloo (CA); Yongtaek Hong, Seoul (KR); Jackson C. S. Lai, Waterloo (CA); Arokia Nathan, Waterloo (CA)

(73) Assignee: Carestream Health, Inc., Rochester, NY (US)

( * ) Notice: Subject to any disclaimer, the term of this patent is extended or adjusted under 35 U.S.C. 154(b) by 0 days.

(21) Appl. No.: 11/531,707

(22) Filed: Sep. 14, 2006

(65) Prior Publication Data

US 2008/0067324 A1    Mar. 20, 2008

(51) Int. Cl.
*H01L 31/00* (2006.01)
(52) U.S. Cl. .................................. 250/214.1; 257/444
(58) Field of Classification Search ............. 250/214.1; 257/444, 446, 448, 458, 462
See application file for complete search history.

(56) References Cited

U.S. PATENT DOCUMENTS

| 4,323,912 | A | * | 4/1982 | Koike et al. ................. 257/293 |
| 4,429,325 | A | * | 1/1984 | Takasaki et al. ............. 257/444 |
| 5,162,933 | A | * | 11/1992 | Kakuda et al. ................ 349/46 |
| 5,182,624 | A | | 1/1993 | Tran et al. |
| 5,235,195 | A | | 8/1993 | Tran et al. |
| 5,516,712 | A | | 5/1996 | Wei et al. |
| 5,619,033 | A | | 4/1997 | Weisfield |
| 5,657,139 | A | | 8/1997 | Hayashi |
| 5,693,567 | A | | 12/1997 | Weisfield et al. |
| 5,770,871 | A | | 6/1998 | Weisfield |
| 5,789,737 | A | | 8/1998 | Street |
| 5,831,258 | A | | 11/1998 | Street |

(Continued)

FOREIGN PATENT DOCUMENTS

EP    1 760 788 A2    3/2007

OTHER PUBLICATIONS

Richard L. Weisfield, "Large-Area Amorphous Silicon TFT-Based X-Ray Image Sensors For Medical Imaging And Non destructive Testing," Electrochemical Society Proceedings of the Fourth Symposium, ISSN 0161-6374, 1998.

(Continued)

*Primary Examiner*—Seung C Sohn

(57) ABSTRACT

A photosensor array includes data and scan lines (124, 148), circuitry of each data line/scan line pair formed in a backplane (110) on a substrate (102). On a first electrode scan line (148) a switching element (112) responds to a scan signal, connecting a first terminal (106) to a second terminal (108). A front plane (120) has sensing elements (122) indicating a measure of a received stimulus and including a charge collection electrode (130). An insulating layer (140) disposed between the backplane (110) and the front plane (120) contains at least a first via (136) connecting the first terminal (108) of the switching element (112) in the backplane (110) to a charge collection electrode (130) of the sensing element (122) in the front plane (120). A second via (126) connects between the second terminal (108) of the switching element (112) and the data line (124).

21 Claims, 13 Drawing Sheets

U.S. PATENT DOCUMENTS

| | | | |
|---|---|---|---|
| 6,005,238 A | | 12/1999 | Mei et al. |
| 6,011,274 A | | 1/2000 | Gu et al. |
| 6,060,714 A | * | 5/2000 | Zhong et al. ............ 250/370.09 |
| 6,124,606 A | | 9/2000 | den Boer et al. |
| 6,137,151 A | | 10/2000 | Street |
| 6,300,648 B1 | * | 10/2001 | Mei et al. ...................... 257/59 |
| 6,407,393 B1 | * | 6/2002 | Kim et al. .............. 250/370.09 |
| 6,459,132 B1 | * | 10/2002 | Mochizuki .................. 257/443 |
| 6,480,577 B1 | | 11/2002 | Izumi et al. |
| 6,607,935 B2 | * | 8/2003 | Kwon ......................... 257/444 |
| 6,660,555 B2 | | 12/2003 | Kim |
| 6,707,066 B2 | | 3/2004 | Morishita |
| 6,734,414 B2 | | 5/2004 | Street |
| 6,798,030 B1 | * | 9/2004 | Izumi et al. ................. 257/428 |
| 6,858,868 B2 | | 2/2005 | Nagata et al. |
| 7,135,706 B2 | * | 11/2006 | Nagata et al. ................ 257/59 |
| 7,208,810 B2 | * | 4/2007 | Wright ....................... 257/444 |
| 7,235,832 B2 | * | 6/2007 | Yaung ....................... 257/292 |
| 2002/0180902 A1 | | 12/2002 | Izumi et al. |
| 2004/0164230 A1 | * | 8/2004 | Izumi et al. .............. 250/214.1 |
| 2004/0195572 A1 | | 10/2004 | Kato et al. |
| 2005/0133879 A1 | * | 6/2005 | Yamaguti et al. ........... 257/435 |
| 2006/0077313 A1 | * | 4/2006 | Liu et al. ...................... 349/55 |

OTHER PUBLICATIONS

Richard L. Weisfield, "Amorphous Silicon TFT X-Ray Image Sensors," Electron Devices Meeting, 1998, IEDM '98 Technical Digest, International.

Richard L. Weisfield, et al., "New Amorphous-Silicon Image Sensor for X-ray Diagnostic Medical Imaging Applications," SPIE Med. Imaging, Phys. Med. Imaging, 1998.

R.A. Street et al., "Two-dimensional Amorphous Silicon Image Sensor Arrays," Journal of Non-Crystalline Solids, vol. 198-200, 1996, pp. 1151-1154.

R.A. Street, et al., "Large Area 2-Dimensional A-SI:H Imaging Arrays," Mat. Res. Soc. Symp. Proc., vol. 258, 1992, pp. 1145-1150.

* cited by examiner

HIGH FILL-FACTOR SENSOR WITH REDUCED COUPLING

FIELD OF THE INVENTION

This invention generally relates to digital radiographic imaging and more particularly relates to an imaging array having an improved fill factor and reduced capacitive coupling between data electrodes and conductive structures.

BACKGROUND OF THE INVENTION

A digital radiography imaging panel acquires image data from a scintillating medium using an array of individual sensors, arranged in a row-by-column matrix so that each sensor provides a single pixel of image data.

For these devices, hydrogenated amorphous silicon (a-Si:H) is commonly used to form the photodiode and the thin-film transistor (TFT) switch. FIG. 1A shows a cross-section (not to scale) of a single imaging pixel 10 in a prior art a-Si:H based flat panel imager. Each imaging pixel 10 has, as shown in FIG. 1B, a photodiode 70 and a TFT switch 71.

A layer of X-ray converter material (e.g., luminescent phosphor screen 12), shown in FIG. 1, is coupled to the photodiode-TFT array. Photodiode 70 comprises the following layers: a passivation layer 14, an indium tin oxide layer 16, a p-doped Si layer 18, an intrinsic a-Si:H layer 20, an n-doped Si layer 22, a metal layer 24, a dielectric layer 26, and glass substrate 28. X-ray photon path 30 and visible light photon path 32 are also shown in FIG. 1A. When a single X-ray is absorbed by the phosphor, a large number of light photons are emitted isotropically. Only a fraction of the emitted light reaches the photodiode and gets detected.

FIG. 1B shows a block diagram of the flat panel imager 80. Flat panel imager 80 consists of a sensor array 81 comprising a matrix of a-Si:H n-i-p photodiodes 70 and TFTs 71, with gate driver chips 82 connected to the blocks of gate lines 83 and readout chips (not shown) connected to blocks of data lines 84 and bias lines 85, having charge amplifiers 86, optional double correlated sampling circuits with programmable filtering (not shown) to help reduce noise, analog multiplexer 87, and analog-to-digital converter (ADC) 88, to stream out the digital image data at desired rates. The operation of the a-Si:H-based indirect flat panel imager is known by those skilled in the art, and thus only a brief description is given here.

Incident X-ray photons are converted to optical photons in the phosphor screen 12, and these optical photons are subsequently converted to electron-hole pairs within the a-Si:H n-i-p photodiodes 70. In general, a reverse bias voltage is applied to bias lines 85 to create an electric field (and hence a depletion region) across the photodiodes and enhance charge collection efficiency. The pixel charge capacity of the photodiodes is determined by the product of the bias voltage and the photodiode capacitance. The image signal is integrated by the photodiodes while the associated TFTs 71 are held in a non-conducting ("off") state. This is accomplished by maintaining gate lines 83 at a negative voltage. The array is read out by sequentially switching rows of TFTs 71 to a conducting state by means of TFT gate control circuitry. When a row of pixels is switched to a conducting ("on") state by applying a positive voltage to corresponding gate line 83, charge from those pixels is transferred along data lines 84 and integrated by external charge-sensitive amplifiers 86. The row is then switched back to a non-conducting state, and the process is repeated for each row until the entire array has been read out. The signal outputs from external charge-sensitive amplifiers 86 are transferred to analog-to-digital converter (ADC) 88 by parallel-to-serial multiplexer 87, subsequently yielding a digital image. The flat panel imager is capable of both single-shot (radiographic) and continuous (fluoroscopic) image acquisition.

Because of the scale of sensor devices and the proximity of data lines to other electrodes and conductive components, the problem of capacitive coupling is a particular concern with digital radiology sensors. Unless some corrective action is taken, capacitive coupling can degrade functions of the sensing array for both signal measurement and data accuracy. There have been a number of proposed solutions in response to this problem. For example, U.S. Pat. No. 5,770,871 (Weisfield) describes the use of an insulating anti-coupling layer interposed between charge collection electrodes and data lines. Similarly, U.S. Pat. No. 6,858,868 (Nagata et al.) describes an interlayer insulating film provided between data and analog signal electrodes. U.S. Pat. No. 6,124,606 (den Boer et al.) describes the use of an insulating layer having a low dielectric constant for reducing parasitic capacitance where collector electrodes overlap switching devices. U.S. Pat. No. 6,734,414 (Street) describes a method for reduced signal coupling by a particular routing pattern for readout control signal lines for columns of pixels.

For many types of conventional sensing devices, the photosensor device itself, typically a photodiode or PIN diode, only occupies a portion of the surface area. Switching devices used to switch the photosensor component to a read-out device take up a sizeable portion of the area of each pixel. As a result, the sensor device suffers from relatively poor fill-factor and is able to use only a fractional portion of the light emitted from the phosphor screen. As one example, U.S. Pat. No. 5,516,712 (Wei et al.) describes a pixel with side-by-side photosensor and switching thin-film transistor (TFT) elements. More recently, designs using photosensors stacked atop their switching components have been employed, providing some measure of improved efficiency. For example, U.S. Pat. No. 6,707,066 (Morishita) describes a photodetection apparatus having photodiodes positioned atop switching TFT devices, thus closer to scintillation material in the imaging device. U.S. Pat. No. 5,619,033 (Weisfield) describes a stacked arrangement with the photodiode atop its switching TFT component, relative to the illumination path.

The use of tightly stacked photosensor and TFT components has advantages for increasing the effective fill factor of the sensing array. However, with more compact packaging comes the complication of increased signal coupling between data and switching electrodes and increased thermal or "dark state" noise due to Johnson noise effects. The capacitive coupling problem becomes even more acute when the imaging array is formed on a conductive stainless steel substrate. Stainless steel and similar metals have characteristics such as good flexibility and are relatively robust and lightweight. The use of a stainless steel substrate allows manufacture of a thin imaging plate for radiographic imaging. However, capacitive coupling effects can compromise the overall performance of a plate formed on a stainless steel substrate.

One way to reduce thermal noise is to increase the conductivity of data traces, thereby reducing resistance. This can be effected by increasing conductor thickness and by a suitable choice of conductive material. The conductive materials that are conventionally used for making connections to array sensing electronics are not ideal conductors and must be selected from among a somewhat limited group of materials. Typically, for example, chromium is used for connection to doped silicon components. Aluminum, although a better conductor, exhibits a tendency to diffuse into silicon and to form hillockand whisker-type defects at high temperatures, rendering it an unsuitable alternative for many semiconductor designs.

Techniques for reducing capacitive coupling effects include increasing the separation distance between conductive surfaces and decreasing the effective dielectric constant of the insulation between switching and signal electrodes. However, current fabrication techniques typically form these metal electrode structures on the backplane with a thin a-SiN:H dielectric separation layer that is typically only a few hundred nanometers thick, resulting in generally higher coupling, higher crosstalk levels. This could also result in increasing the likelihood of interlayer shorts manufacturing defects.

Thus, what is needed is an apparatus that provides both high fill factor for improved efficiency and, at the same time, reduces capacitive coupling and crosstalk between control and signal lines in the array device.

SUMMARY OF THE INVENTION

It is an object of the present invention to provide a photosensor array having array circuitry that includes data lines and scan lines and, for each data line/scan line pair, cell circuitry; the cell circuitry of each data line/scan line pair comprising:
 a) a backplane comprising:
  (i) a substrate;
  (ii) a first electrode scan line disposed over the substrate;
  (iii) a switching element for responding to a scan signal from the scan line by electrically connecting a first terminal to a second terminal to provide an electric signal to pass between the first terminal and the second terminal;
 b) a front plane, comprising:
  (i) one or more sensing elements for receiving a stimulus and for providing an electric signal indicating a measure of the received stimulus, the sensing element including a charge collection electrode;
  (ii) a data line for reading out the electric signal;
 c) an insulating layer of at least about 2 microns thickness disposed between the backplane and the front plane, containing at least:
  (i) a first via forming an electrical connection between the first terminal of the switching element in the backplane and a charge collection electrode of the sensing element in the front plane; and
  (ii) a second via forming electrical connection between the second terminal of the switching element and the data line.

It is an advantage of the present invention that it provides a photosensor array having a high fill factor and having reduced thermal noise and capacitive coupling.

It is a feature of the present invention that it provides improved isolation of data, gate switching, and bias electrodes. The arrangement of the present invention provides significantly reduced coupling when using a conductive substrate. The apparatus of the present invention allows the use of a data line having lower resistance for improved conductivity, resulting in reduced thermal noise. The thick insulator between the front and back planes and the gate dielectric layer helps to reduce capacitive coupling and cross-talk, as well as helps to minimize the possibilities of shorts between conductive layers.

These and other objects, features, and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings, wherein:

DETAILED DESCRIPTION OF THE INVENTION

The present description is directed in particular to elements forming part of, or cooperating more directly with, apparatus in accordance with the invention. It is to be understood that elements not specifically shown or described may take various forms well known to those skilled in the art.

Figure 1A:
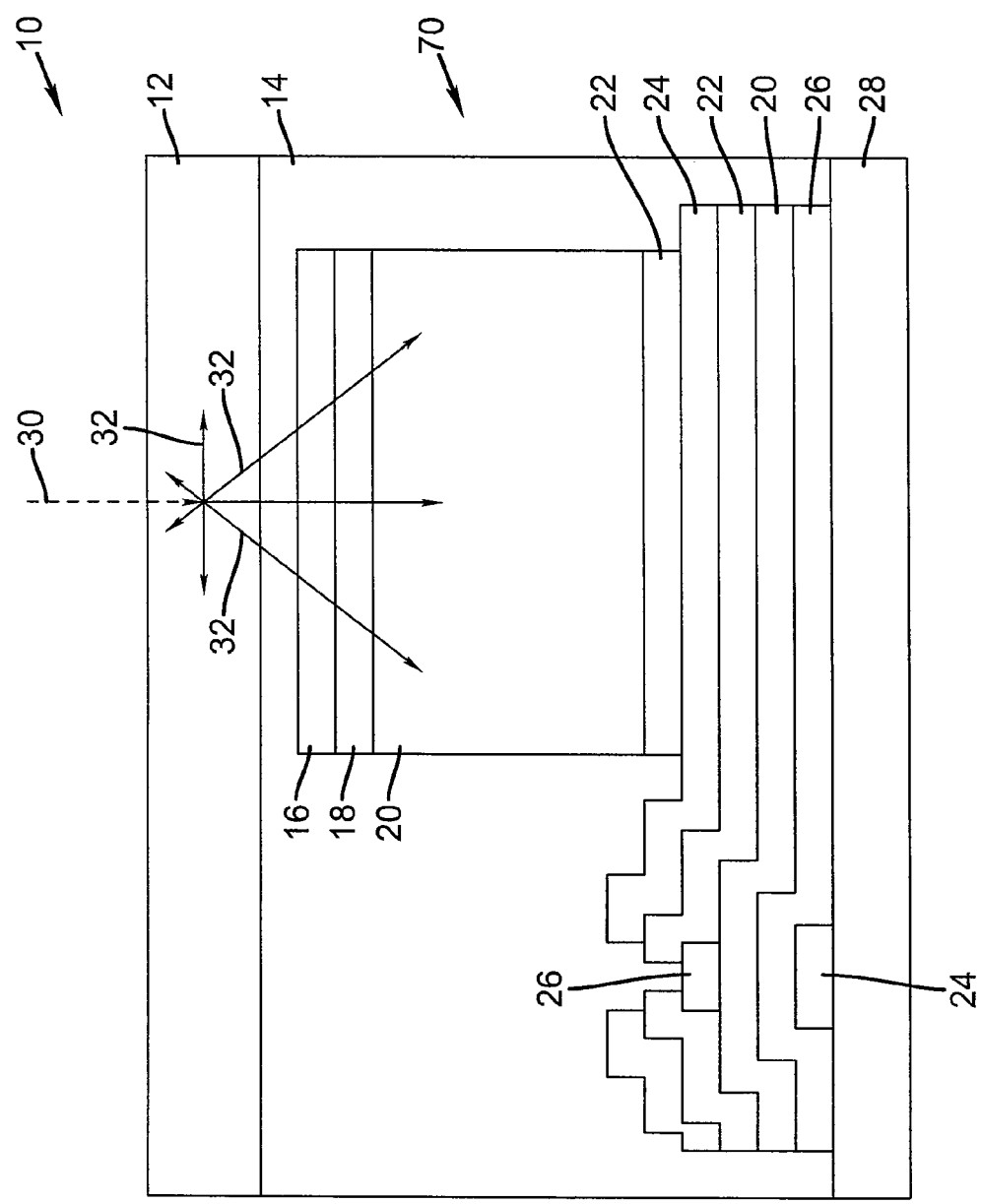
FIG. 1A is a cross-sectional view showing an imaging pixel in a flat-panel imager.
Figure 1B:
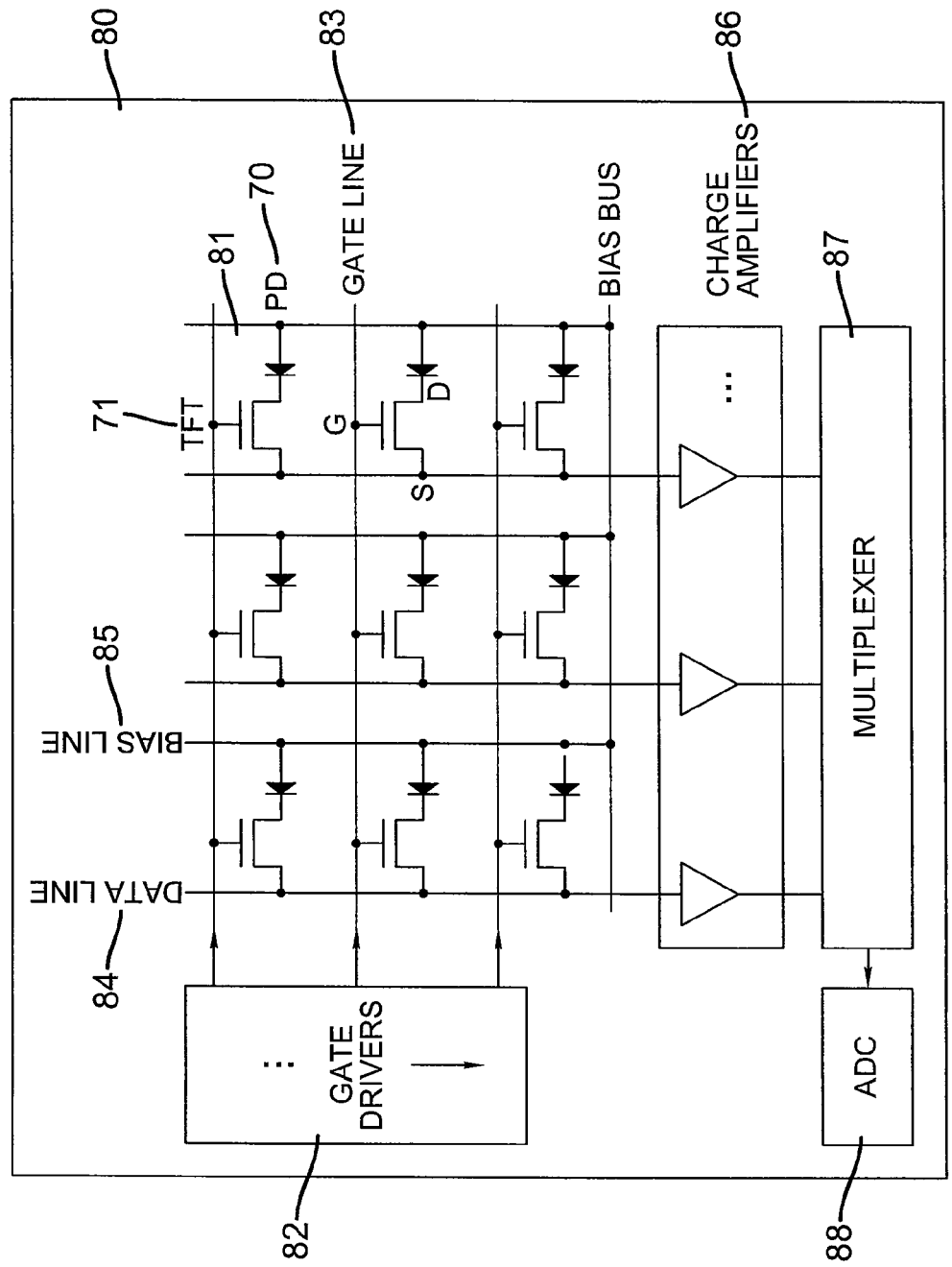
FIG. 1B is a schematic diagram showing components of a flat-panel imager.
Figure 2:
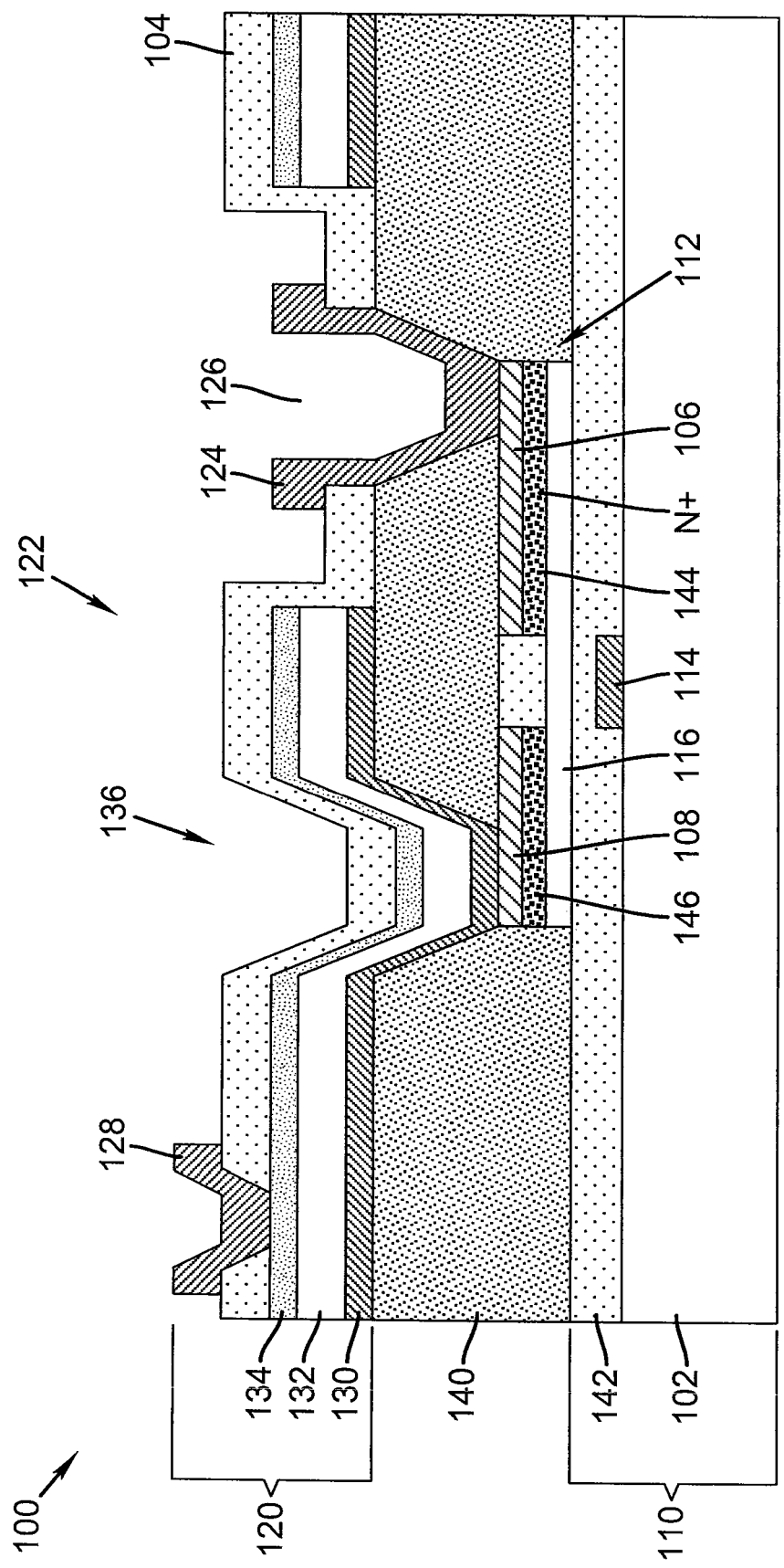
FIG. 2 is schematic cross-sectional view of a pixel sensing circuit according to an embodiment of the present invention.

Referring to FIG. 2, there is shown a cross-sectional view of a pixel sensing circuit 100 according to an embodiment of the present invention. A substrate 102 on which circuit 100 is formed can be glass, plastic, or an inorganic film, polyimide, acrylic resin, benzocyclobutene (BCB), or the like or some other material, including stainless steel, for example, coated with a dielectric, such as BCB or spin-on glass. Electronic components and sensors are fabricated as part of a backplane 110 or a front plane 120. An insulating layer 140 separates backplane 110 from front plane 120. Insulating layer 140 can be, for example, benzocyclobutene (BCB), polyimide, sol-gel, acrylic, or some other suitable material having a suitably low dielectric constant (for example, SiO2, SiNx, and SiON).

Backplane 110 has a switching element 112, typically a thin-film transistor (TFT) or similar component. A gate electrode 114, connected to a scan line, enables switching element 112, forming a closed electrical circuit between terminals 106 and 108 through a channel 116. Doped regions 144 and 146 are provided over channel 116 as shown. Backplane 110 can be formed using conventional TFT deposition and etching techniques, building up an array of switching elements 112 on substrate 102. A gate dielectric layer 142 insulates gate electrode 114.

Front plane 120 has a photosensor 122 that is typically a-Si:H PIN diode or other thin-film semiconductor structure 132 having a top electrode 134 made of transparent conductive material and a bottom electrode 130 for charge collection. Photosensor 122 provides a signal according to the level of radiation of a suitable wavelength that it receives. A bias line 128 provides a voltage bias for photosensor 122. A first via 126 is formed in order to connect a data electrode 124 on the surface of front plane 120 with terminal 106 on switching element 112, which is on backplane 110. A portion of bottom electrode 130 forms another via 136 that connects photosensor 122 with terminal 108 on backplane 110. Front plane 120 may have a passivation-layer 104. An optional antireflection material can also be used.

It can be seen that the arrangement of FIG. 2 allows stacking of photosensor 122 on top of switching elements 112, relative to the plane of substrate 102. This not only provides a compact arrangement, but also helps to increase fill factor for each pixel. Unlike earlier embodiments using silicon substrates and components, the apparatus of the present invention can use more conductive metals, such as aluminum, rather that less conductive metals that are conventionally used, such as chromium, for example. For example, the use of via 126 allows data line 124 to be formed from aluminum. There is minimal concern with component degradation due to migration of metal atoms into the base materials of switching element 112. This would be a problem with conventional designs where data electrodes come into contact with silicon. Besides, using the method of the present invention, the data line is typically formed at the end of the fabrication process and there are no subsequent high-temperature steps. This eliminates potential reliability problems associated with high-temperature formation of hillock- and whisker-type defects in the aluminum layer, such as are known to be the cause of electrical shorts. In addition, a thick aluminum layer, of the order of 1 micron or more, can be used with this arrangement. This can further reduce electrical resistance of the data line and thus reduce data line thermal noise.

Figure 3:
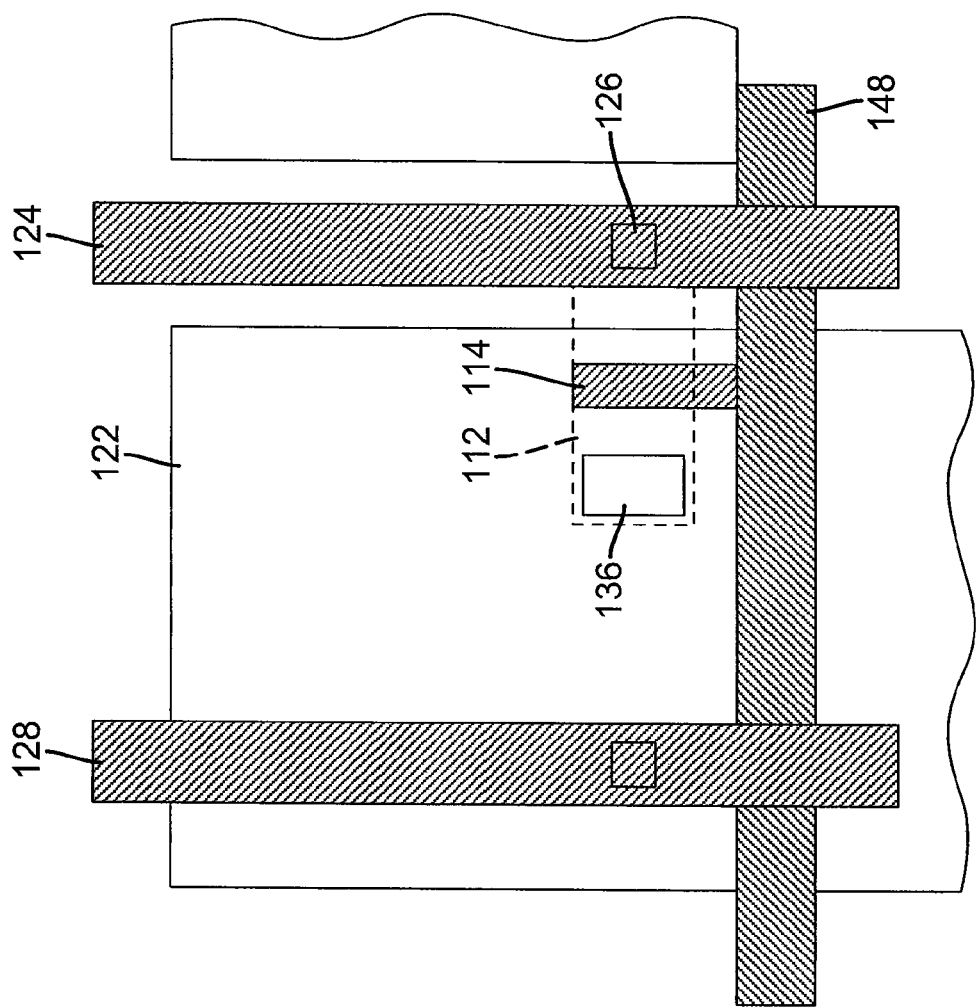
FIG. 3 is a top view of a pixel sensing circuit showing representative locations of data and signal electrodes in one embodiment.
Figure 4:
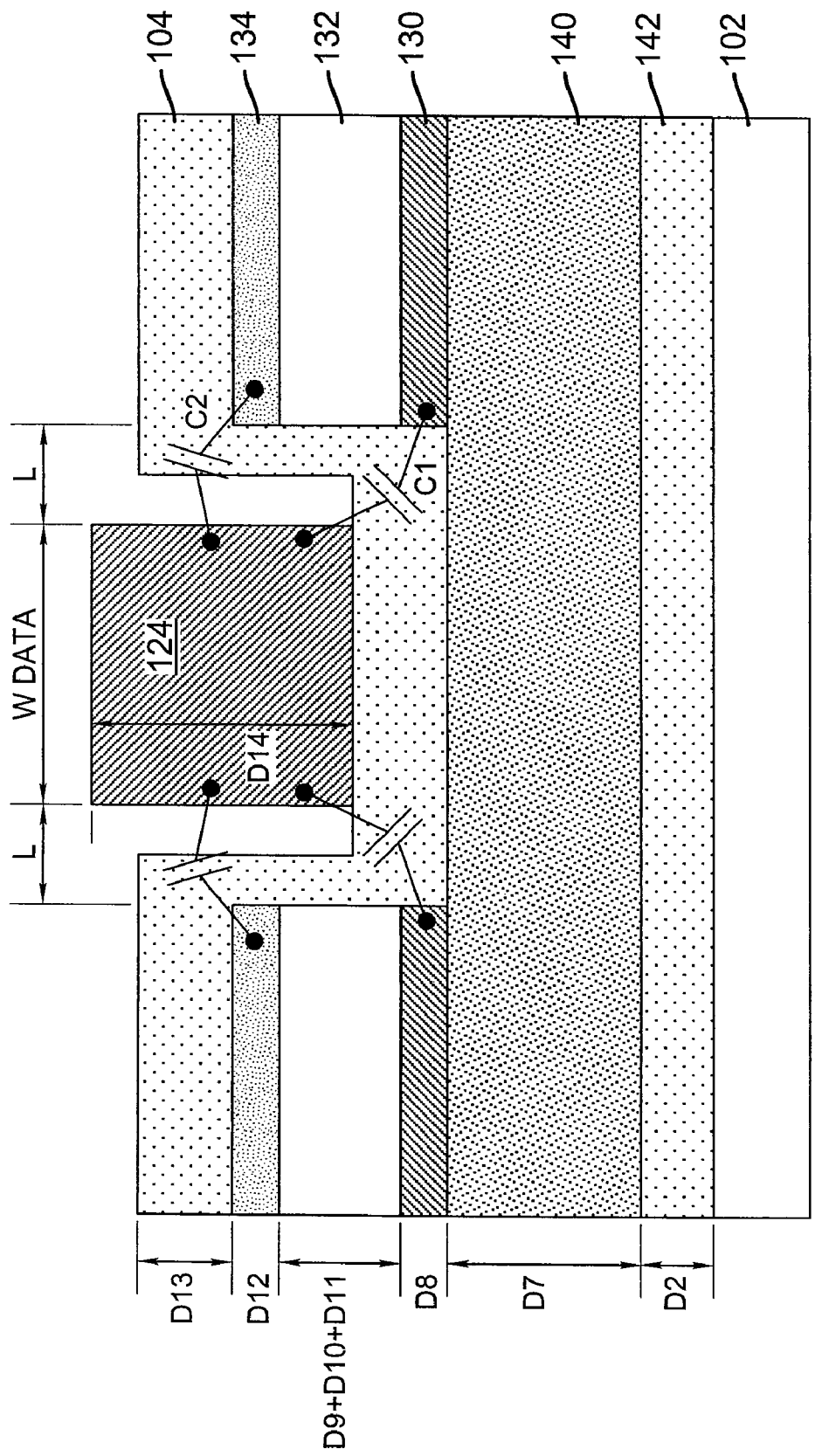
FIG. 4 is a schematic diagram showing sources of parasitic capacitive coupling.

FIG. 3 is a top view of a pixel sensing circuit showing representative locations of data and signal electrodes in one embodiment. The proximity of bias line 128, gate line 148, and data line 124 would typically represent a parasitic capacitive coupling problem. Typically, gate and data lines are separated by no more than about 200 to 300 nm of silicon nitride. This can cause unwanted capacitive coupling, as shown in FIG. 4. However, when using the arrangement of the present invention, as shown in FIG. 2, gate line 148 is on backplane 110, well-separated from bias line 128 and data line 124 which are formed on front plane 120. Typical separation distance is at least greater than about 2 microns, more preferably in excess of 3 microns with the present invention, using a material having a lower dielectric constant, such as BCB in insulating layer 140. This reduces coupling and also provides an inherent improvement in fabrication yields.

Referring to the cross-sectional representation of FIG. 4, some of the more significant potential sources of parasitic capacitance are represented. There is a capacitance C1 between data line 124 and bottom electrode 130 of photosensor 122. There is another parasitic capacitance C2 between data line 124 and anode 134 of photosensor 122. Notably, due largely to the width of insulating layer 140 that lies between data line 124 and substrate 102, parasitic capacitance between data line 124 and substrate 102, if conductive, would be minimal with this embodiment. There is also parasitic capacitance at the "crossover" of data line 124 and gate line 148 or at bias line 128 and gate line 148. This effect is mitigated by the design of the present invention, which increases the separation between data line 124 and bias lines 128. Additionally, for embodiments where substrate 102 is conductive, another source of parasitic capacitance is between terminal 106 and substrate 102.

Figure 5A:
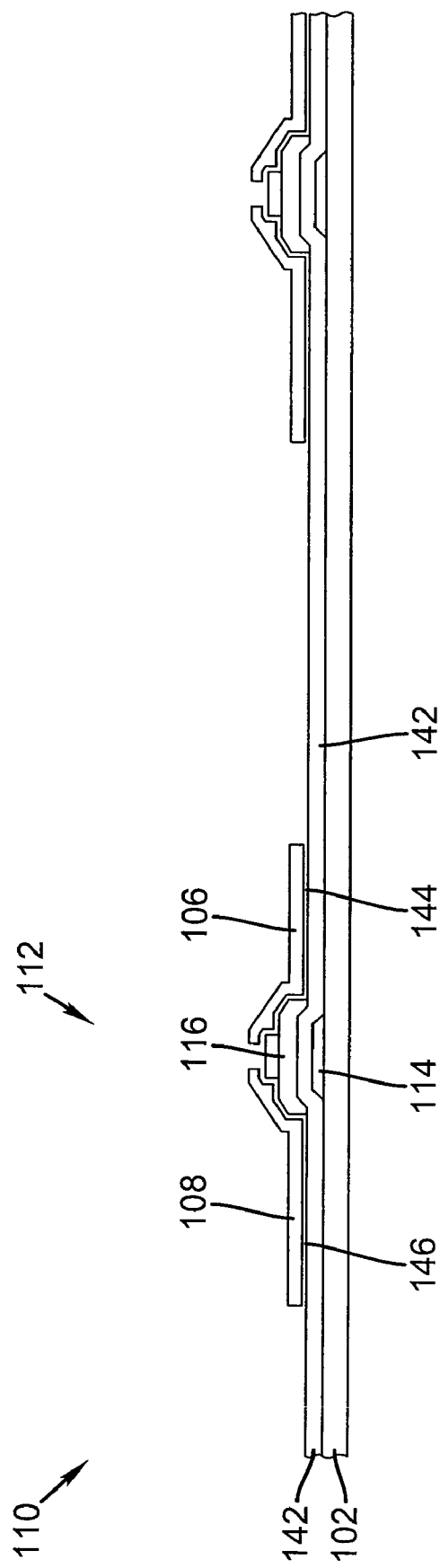
FIG. 5A is schematic cross-sectional view showing a TFT switching element of the pixel.
Figure 5B:
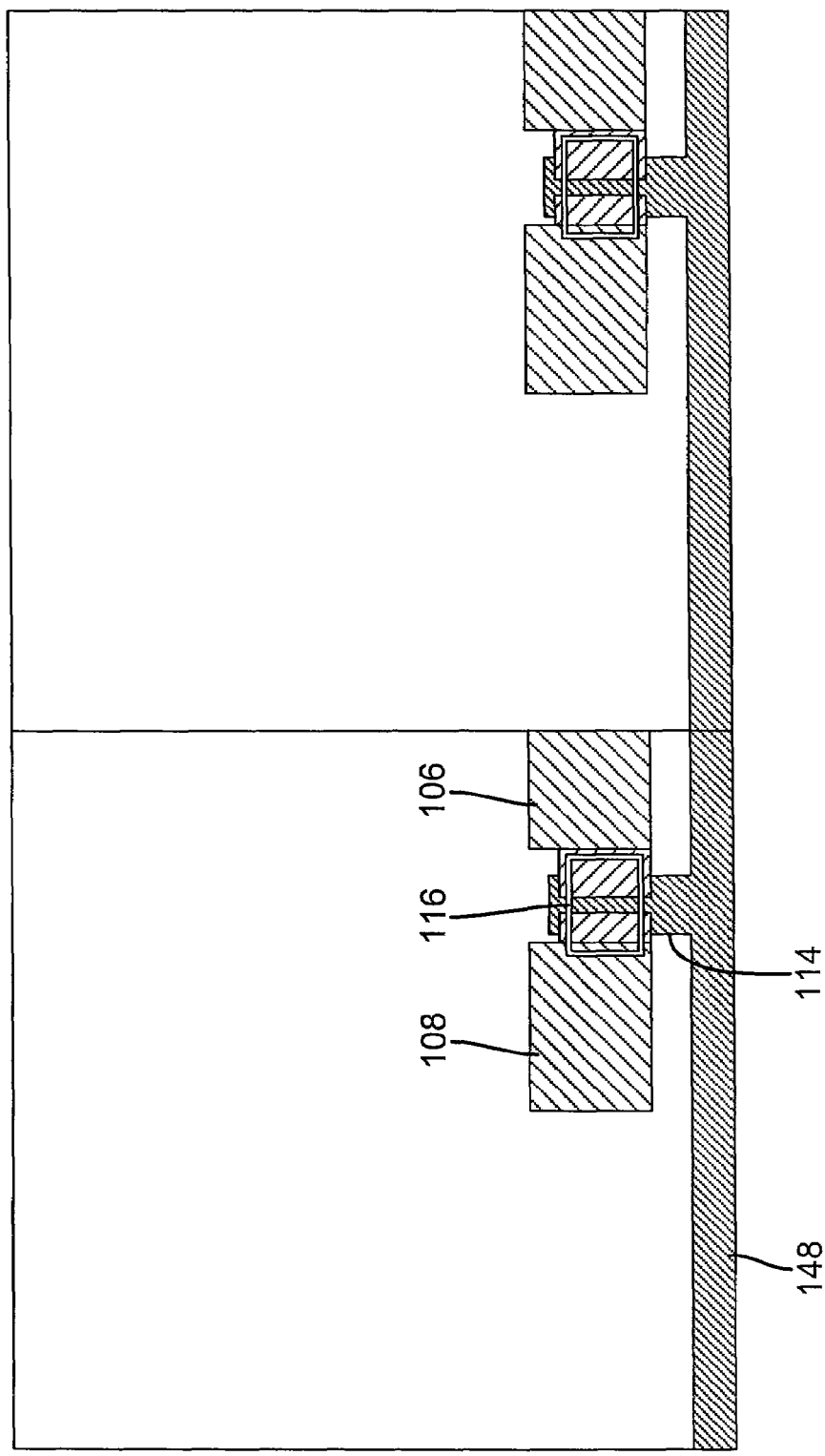
FIG. 5B is a top view showing the layered structure for the TFT device in FIG. 5A.

FIGS. 5A through 8B show various steps for fabrication of pixel sensing circuit 100. FIG. 5A is a side view showing TFT formation in a fabrication step for backplane 110. FIG. 5B is a top view showing the layered structure for the TFT device in FIG. 5A. In this step, it is instructive to note that only gate line 148 and its extending gate electrodes 114 are formed on substrate 102, as components of backplane 110. As has been noted earlier, other signal lines are formed as components of front plane 120.

Switching element 112 is formed as a TFT, by depositing gate dielectric layer 142 onto gate electrode 114, then depositing channel 116 and doped regions 144, 146. Electrodes 106, 108, which can be metal or other suitable conductive material, are deposited as a final step in fabrication of backplane 110. As can be appreciated by those skilled in the electronic device fabrication arts, other arrangements for TFT structure and other fabrication sequences are possible.

Figure 6A:
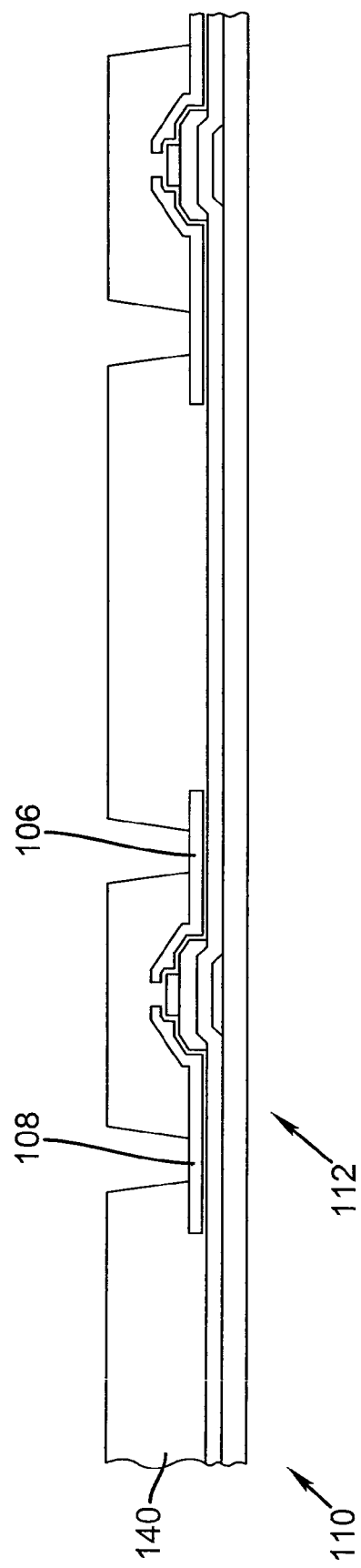
FIG. 6A is schematic cross-sectional view showing TFT formation with an insulating separation layer in a subsequent fabrication step.
Figure 6B:
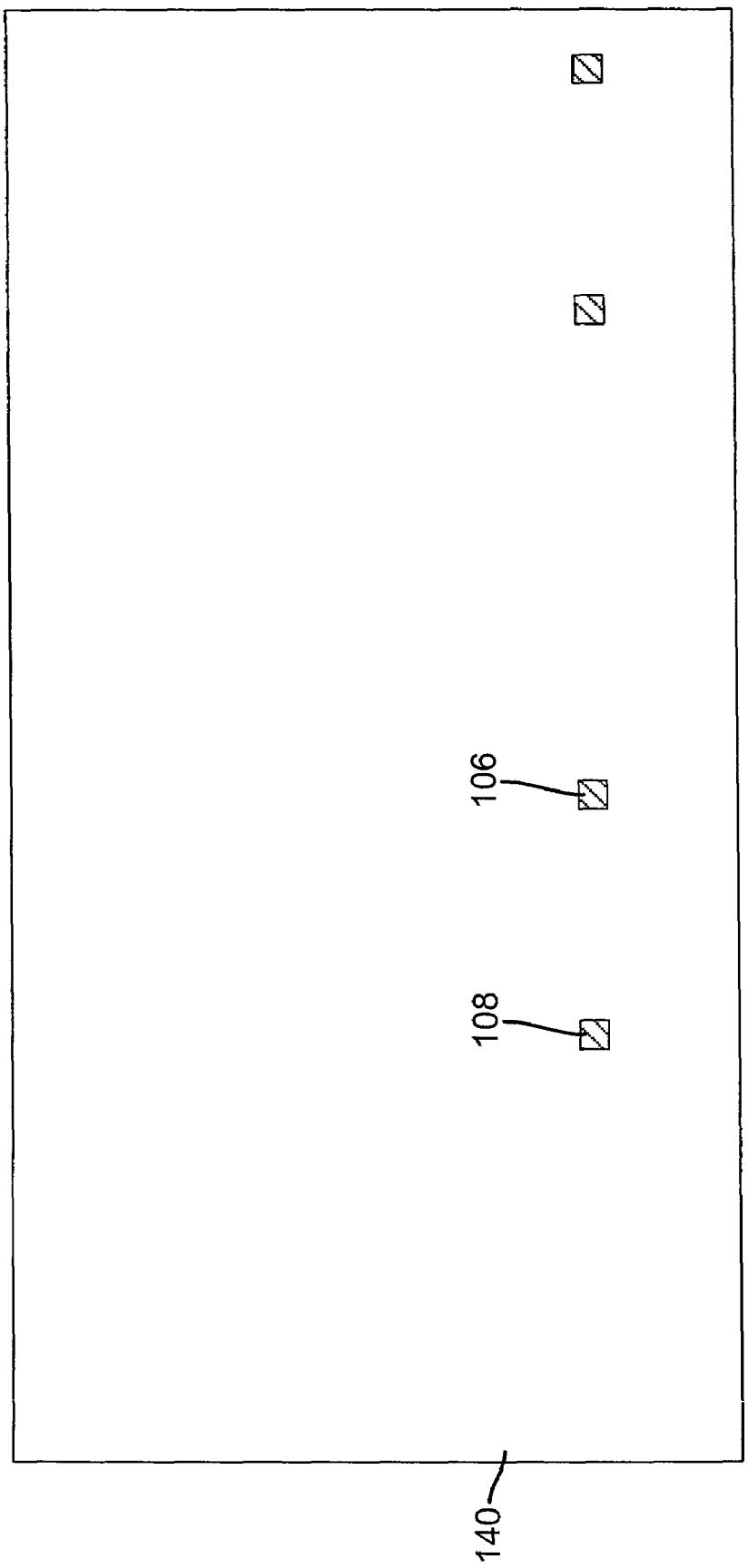
FIG. 6B is a top view showing the locations for vias etched into the insulating separation layer in FIG. 6A.

The side view of FIG. 6A and top view of FIG. 6B show the fabrication of insulating layer 140. To form insulating layer 140, material is deposited, then etched to expose electrodes 106 and 108, to which vias 136 and 126, respectively, will be connected to provide electronic communication between backplane 110 and front plane 120. Alternatively, photosensitive dielectric material, such as photo-acrylic or the like, can be used as dielectric layer 140. In that case, vias 126 and 136 can be formed using a process similar to photolithography.

Figure 7A:
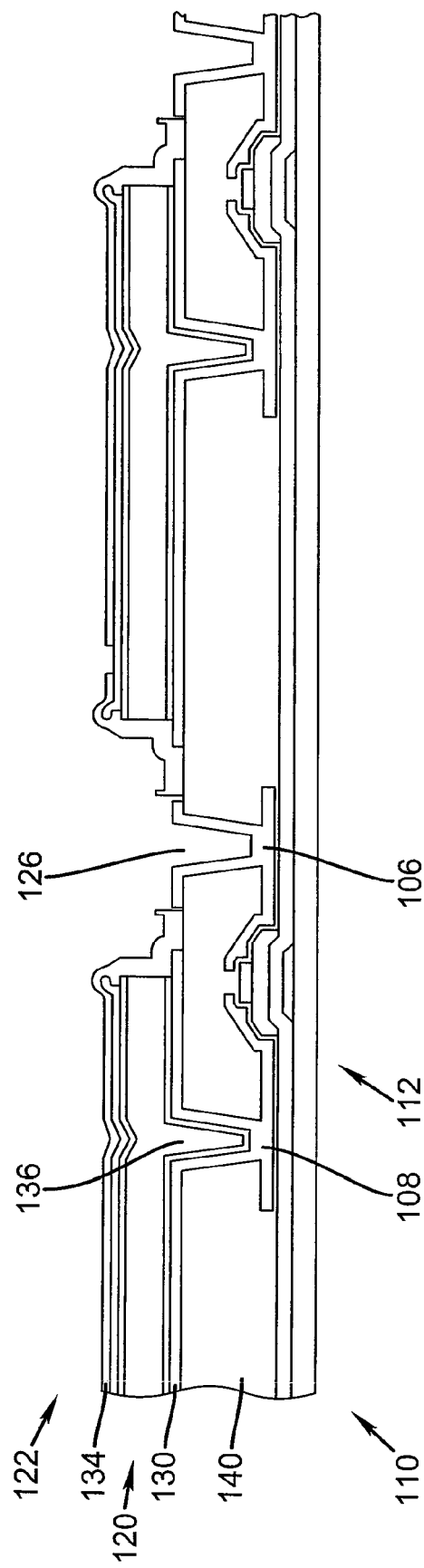
FIG. 7A is schematic cross-sectional view showing the photodiode deposited atop the TFT device in a subsequent fabrication step.
Figure 7B:
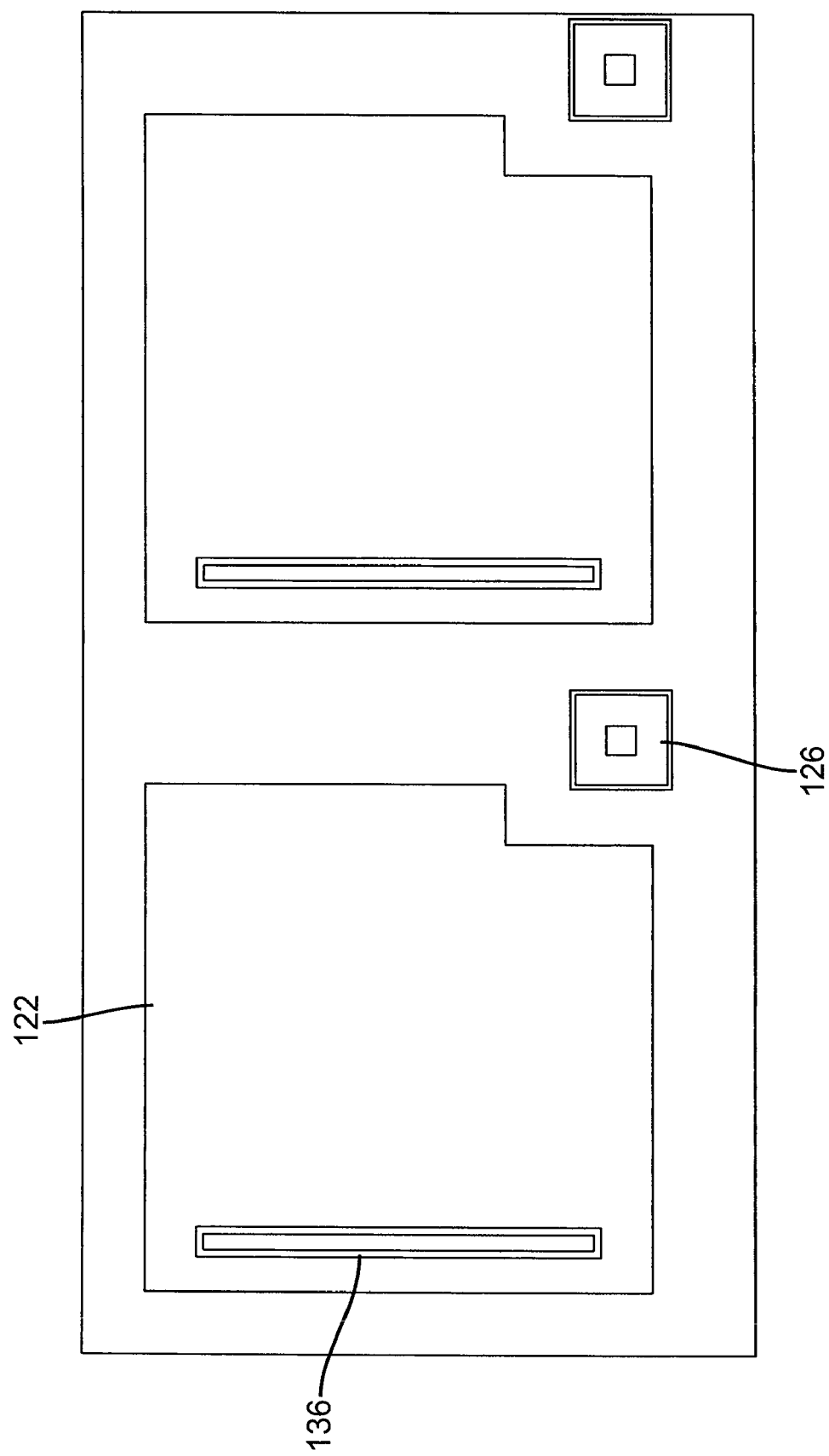
FIG. 7B is a top view showing the photodiode layout for the step shown in FIG. 7A.

The side view of FIG. 7A and top view of FIG. 7B show fabrication of front plane 120 components. Component layers of photosensor 122 are deposited, with cathode 130, as charge collection electrode of photosensor 122, making one connection to terminal 108 of switching element 112 through via 136. Via 126 is formed using a metal or other conductive material that makes electrical connection to terminal 106 of switching element 112. When photosensor 122 is a photodiode, it may be fabricated using an n+ doped layer formed over cathode 130, an amorphous silicon layer formed over the n+ doped layer, and a p+ doped layer formed atop the amorphous silicon layer. Anode 134 can then be formed over the p+ doped layer.

Figure 8A:
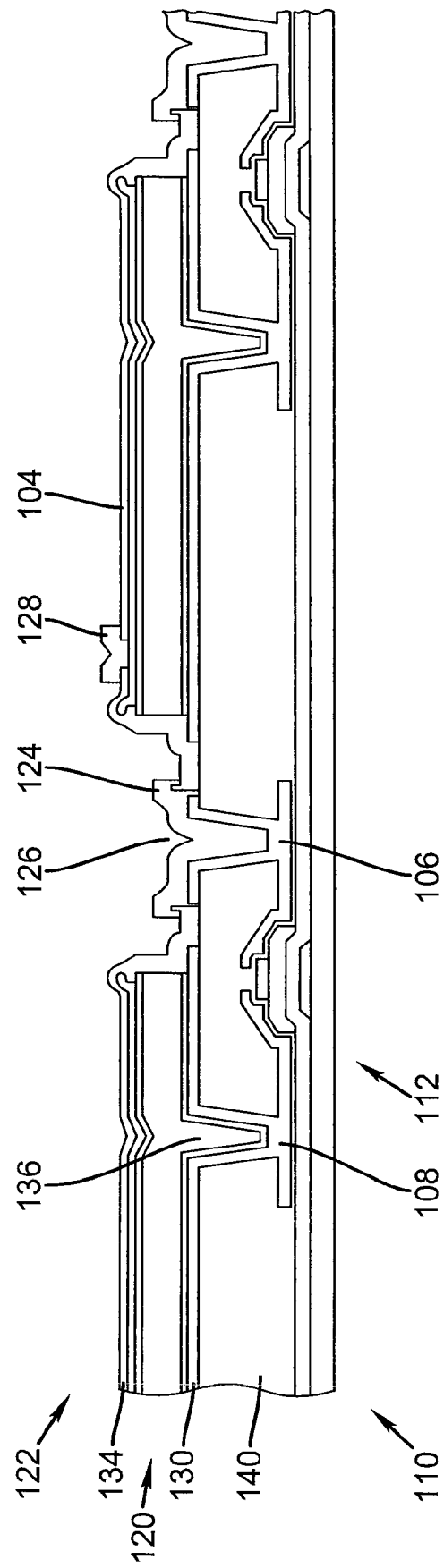
FIG. 8A is schematic cross-sectional view showing via and bias line formation in a subsequent fabrication step.
Figure 8B:
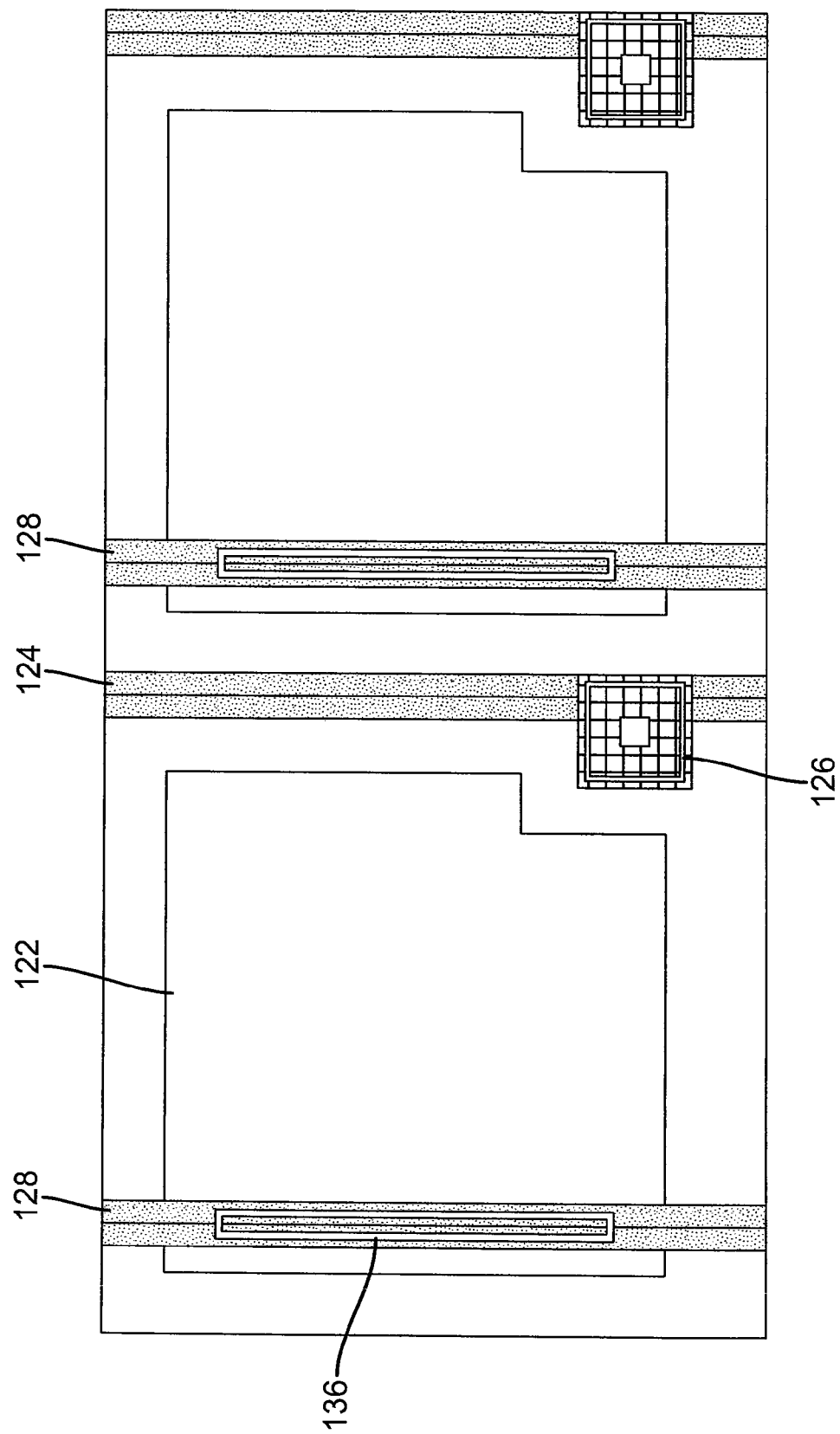
FIG. 8B is a top view showing the completed pixel sensing circuit of FIG. 8A.

The side view of FIG. 8A and top view of FIG. 8B show final steps in the fabrication of front plane 120 of pixel sensing circuit 100 in this embodiment. Via 126 is joined to data electrode 124 that extends to multiple pixel sensing circuits 100 in the same column of the pixel or sensor array. Data electrode 124 can be relatively thick aluminum layer, of the order of 1 micron or more, or can be thin copper, such as 0.5 microns in one embodiment. Optionally, data electrode 124 can be formed using a stack of metal layers, including layers of aluminum or copper, for example. Bias line 128 is added to provide a bias signal to anode 134 of photosensor 122.

As one advantage, the method of the present invention allows fabrication of sensor array 81 at lower temperatures, including those in the range of 100-200 degrees C., simplifying manufacture. This also allows an expanded variety of inner layer dielectrics to be used, making it easier to fabricate a flat panel imaging apparatus using standard processes. For example, the use of acrylic as an inner layer dielectric is a standard practice in display LCD manufacturing; however, the use of this type of material for imaging panels has been constrained by temperature.

The invention has been described in detail with particular reference to certain preferred embodiments thereof, but it will be understood that variations and modifications can be effected within the scope of the invention as described above, and as noted in the appended claims, by a person of ordinary skill in the art without departing from the scope of the invention. For example, photosensor 122, shown as a PIN diode in FIG. 2 and elsewhere, could also be some other type of sensor component or a metal insulator semiconductor (MIS) photosensor. An MIS photosensor could have a gate dielectric formed over the charge collection electrode, an amorphous silicon layer formed over the gate insulator, an n+ layer formed over the amorphous silicon layer, and a bias electrode.

Thus, what is provided is an imaging array having an improved fill factor, reduced data line capacitive coupling, and low-resistance data line metallization, thereby offering reduced noise and an improved signal-to-noise ratio.

PARTS LIST 10 pixel
12 phosphor screen
14 passivization layer
16 indium tin oxide layer
18 Si layer
20 a-Si:H layer
22 Si layer
24 metal layer
26 dielectric layer
28 glass substrate
30 X-ray photon path
32 visible light photon path
70 photodiode
71 TFT switch
80 flat panel imager
81 sensor array
82 driver chip
83 gate lines
84 data line
85 bias line
86 amplifier
87 multiplexer
88 A-D converter
100 pixel sensing circuit
102 substrate
104 layer
106 terminal
108 terminal
110 backplane
112 switching element
114 gate electrode
116 channel
120 front plane
122 photosensor
124 data electrode
126 via
128 bias line
130 bottom electrode
132 thin-film semiconductor structure
134 top electrode
136 via
140 insulating layer
142 layer
144 doped region
146 doped region
148 gate line

The invention claimed is:

1. A photo-sensor array including a plurality of pixel sensing circuits, each pixel sensing circuit comprising:
  a backplane comprising:
    (i) a substrate;
    (ii) a gate electrode formed on the substrate and connected with a scan line common to a plurality of the pixel sensing circuits; and
    (iii) a switching element comprising a first terminal and a second terminal, the switching element communicating with the gate electrode to respond to a scan signal from the scan line by electrically connecting the first terminal to the second terminal to provide a first electric signal to pass between the first terminal and the second terminal;
  an insulating layer disposed on the backplane;
  a front plane comprising a plurality of layers deposited sequentially from a first side of the front plane proximate the backplane, the plurality of layers forming:
    (i) a sensing element comprising one or more of the plurality of layers and including a charge collection electrode, the sensing element disposed over the first terminal of the switching element, the sensing element receiving a stimulus and providing a second electric signal indicating a measure of the received stimulus; and
    (ii) a data electrode disposed over the second terminal of the switching elements and comprising at least one of the plurality of layers distinct from the one or more of the plurality of layers comprising the sensing elements, the at least one of the plurality of layers comprising the data electrode deposited after deposition of all of the plurality of layers comprising the sensing element, the data electrode connected with a data line common to a plurality of pixel sensing circuits;
  a first via disposed through the insulating layer and forming an electrical connection between the first terminal of the switching element in the backplane and the charge collection electrode of the sensing element in the front plane; and
  a second via disposed through the insulating layer and forming an electrical connection between the second terminal of the switching element in the backplane and the data electrode in the front plane.

2. The array of claim 1 in which the switching element is a thin film transistor (TFT) comprising:
  a) the gate electrode electrically connected to the scan line;
  b) an insulator formed over the gate electrode;
  c) an amorphous silicon layer formed over the insulator;
  d) two or more n+ doped regions formed over the amorphous silicon layer; and
  e) metal electrodes contacting the n+ doped regions forming the first and second terminals.

3. The array of claim 1 in which the sensing element is a photodiode comprising:
  a) an n+ layer formed over the charge collection electrode;
  b) an amorphous silicon layer formed over the n+ layer;
  c) a p+ layer formed over the amorphous silicon layer; and
  d) a conductive layer formed over the p+ layer.

4. The array of claim 1 in which the sensing element is a photodiode comprising:
  a) a bias electrode;
  b) a p+ layer formed over the bias electrode;
  c) an amorphous silicon layer formed over the p+ layer;
  d) a n+ layer formed over the amorphous silicon layer; and e) wherein the charge collection electrode is formed over the n+ layer.

5. The array of claim 1 in which the sensing element is a metal-insulator-semiconductor (MIS) photosensor comprising:
   a) a dielectric formed over the charge collection electrode;
   b) an amorphous silicon layer formed over the dielectric; and
   c) an n+ layer formed over the amorphous silicon layer, and wherein the pixel sensing circuit further comprises:
   a bias electrode.

6. The array of claim 1 in which the sensing element is a metal-insulator-semiconductor (MIS) photosensor comprising:
   a) a bias electrode;
   b) a gate dielectric formed over the bias electrode;
   c) an amorphous silicon layer formed over the gate dielectric;
   d) an n+ layer formed over the amorphous silicon layer; and
   e) the charge collection electrode.

7. The array of claim 1 in which the insulating layer is comprised of benzo-cyclo-butene.

8. The array of claim 1 in which the insulating layer is comprised of polyimide.

9. The array of claim 1 in which the insulating layer is comprised of sol-gel.

10. The array of claim 1 in which the data-line is comprised of aluminum of at least 0.5 micron thickness.

11. The array of claim 1 in which the data-line is comprised of a stack of metal layers, at least one of which is aluminum of at least 0.5 microns thickness.

12. The array of claim 1 in which the data-line is comprised of copper of 0.5 microns thickness.

13. The array of claim 1 in which the data-line is comprised of a stack of metal layers, at least one of which is copper of at least 0.5 micron thickness.

14. The array of claim 1 in which a colorant is contained within the insulating layer to prevent light from penetrating to the backplane.

15. The array of claim 14 wherein said colorant is a dye, pigment, or carbon.

16. The array of claim 1 wherein the insulating layer is acrylic.

17. The array of claim 1, wherein the thickness of the insulating layer is at least 2 microns.

18. The array of claim 1, wherein the substrate is stainless steel.

19. A method of fabricating a photo-sensor array on a substrate comprising:
   (a) forming a backplane by forming an electrode scan line disposed over the substrate and forming a switching element responsive to a scan signal on the electrode scan line by electrically connecting a first terminal to a second terminal;
   (b) depositing an insulating layer over the backplane, the insulating layer patterned to include a first via corresponding to the first terminal of the switching element and a second via corresponding to the second terminal of the switching element; and
   (c) forming a front plane after depositing the insulating layer, the front plane comprising one or more sensing elements providing a sensor signal corresponding to the amount of received light at a charge collection electrode and in communication with the first terminal of the switching element through the first via in the insulating layer; forming a data line subsequent to forming the one or more sensing elements in communication with the second terminal of the switching element through the second via in the insulating layer; and forming a bias line for providing a bias charge to the one or more sensing element.

20. A photo-sensor array having array circuitry that includes data lines and scan lines and, for each data line/scan line pair, cell circuitry; the cell circuitry of each data line/scan line pair comprising:
   a switching element for responding to a scan signal from a scan line by electrically connecting a first terminal to a second terminal to provide a first electric signal to pass between the first terminal and the second terminal;
   a first electrode contacting the first terminal;
   a photosensitive layer overlying the first electrode and having a void proximate the second terminal; and
   a data line disposed in the void of the photosensitive layer and contacting the second terminal, the data line being formed after the photosensitive layer.

21. The array of claim 1, wherein the data line is made of aluminum.

* * * * *